(12) United States Patent
Labanc et al.

(10) Patent No.: US 12,424,425 B2
(45) Date of Patent: Sep. 23, 2025

(54) RF POWER GENERATOR WITH ANALOGUE AND DIGITAL DETECTORS

(71) Applicant: COMET AG, Flamatt (CH)

(72) Inventors: Anton Labanc, Ehrenkirchen (DE);
Daniel Gruner, Muellheim (DE);
André Grede, Bern (CH)

(73) Assignee: COMET AG, Flamatt (CH)

( * ) Notice: Subject to any disclaimer, the term of this patent is extended or adjusted under 35 U.S.C. 154(b) by 273 days.

(21) Appl. No.: 18/202,555

(22) Filed: May 26, 2023

(65) Prior Publication Data

US 2023/0298871 A1 Sep. 21, 2023

Related U.S. Application Data

(63) Continuation of application No. 17/015,139, filed on Sep. 9, 2020, now Pat. No. 11,705,314.

(30) Foreign Application Priority Data

Sep. 10, 2019 (EP) .................................... 19196359

(51) Int. Cl.
*H01J 37/32* (2006.01)
*C23C 16/02* (2006.01)
*H03F 3/189* (2006.01)
*H01L 21/67* (2006.01)

(52) U.S. Cl.
CPC .... *H01J 37/32944* (2013.01); *C23C 16/0245* (2013.01); *H01J 37/32091* (2013.01); *H01J 37/32174* (2013.01); *H01J 37/3299* (2013.01); *H03F 3/189* (2013.01); *H01J 37/32183* (2013.01); *H01L 21/67069* (2013.01)

(58) Field of Classification Search
None
See application file for complete search history.

(56) References Cited

U.S. PATENT DOCUMENTS

| 5,116,482 | A |   | 5/1992  | Setoyama et al. |
|-----------|---|---|---------|-----------------|
| 5,323,329 | A | * | 6/1994  | Keane ................. H03G 3/3042 700/29 |
| 5,629,653 | A |   | 5/1997  | Stimson |
| 6,332,961 | B1|   | 12/2001 | Johnson et al. |
| 7,750,645 | B2|   | 7/2010  | Pipitone et al. |

(Continued)

FOREIGN PATENT DOCUMENTS

| CN | 102386869 A | 3/2012 |
| CN | 103327724 A | 9/2013 |

(Continued)

*Primary Examiner* — Kenneth B Wells
(74) *Attorney, Agent, or Firm* — The Webb Law Firm

(57) ABSTRACT

Provided is a generator including a power amplifier, at least one sampler, an RF output, a signal generator, a controller including a digital control portion and an analogue control portion, an analogue feedback path between the at least one sampler and the controller enabling an analogue signal representation of a signal to be provided to the controller, and a digital feedback path between the at least one sampler and the controller enabling a digital signal representation of the signal to be provided to the controller. The controller is configured to adjust the RF signal at the RF output from a first state into a second state based on the analogue signal representation and/or the digital signal representation.

23 Claims, 9 Drawing Sheets

(56) References Cited

U.S. PATENT DOCUMENTS

| | | | |
|---|---|---|---|
| 8,055,203 B2 | 11/2011 | Choueiry et al. | |
| 8,213,888 B2 * | 7/2012 | Kuriyama | H03G 3/02 |
| | | | 330/278 |
| 8,264,237 B2 | 9/2012 | Coumou | |
| 8,659,335 B2 | 2/2014 | Nagarkatti et al. | |
| 8,710,926 B2 | 4/2014 | Nagarkatti et al. | |
| 8,952,765 B2 | 2/2015 | Fisk, II et al. | |
| 2002/0159276 A1 * | 10/2002 | Deboy | H02M 3/33507 |
| | | | 363/20 |
| 2006/0232471 A1 | 10/2006 | Coumou | |
| 2007/0008745 A1 | 1/2007 | Joshi et al. | |
| 2008/0179948 A1 | 7/2008 | Nagarkatti et al. | |
| 2009/0045046 A1 | 2/2009 | Pipitone et al. | |
| 2015/0270106 A1 | 9/2015 | Kobayashi et al. | |
| 2017/0018926 A1 | 1/2017 | Coumou et al. | |

FOREIGN PATENT DOCUMENTS

| | | |
|---|---|---|
| CN | 103384144 A | 11/2013 |
| CN | 107544464 A | 1/2018 |
| CN | 109639275 A | 4/2019 |
| EP | 1410809 A1 | 4/2004 |
| EP | 1995759 A2 | 11/2008 |
| JP | 2008226820 A | 9/2008 |
| JP | 2011519115 A | 6/2011 |
| JP | 2012185922 A | 9/2012 |
| JP | 2012531880 A | 12/2012 |
| TW | 201419371 A | 5/2014 |
| WO | 2014036169 A1 | 3/2014 |
| WO | 2017040415 A1 | 3/2017 |

* cited by examiner

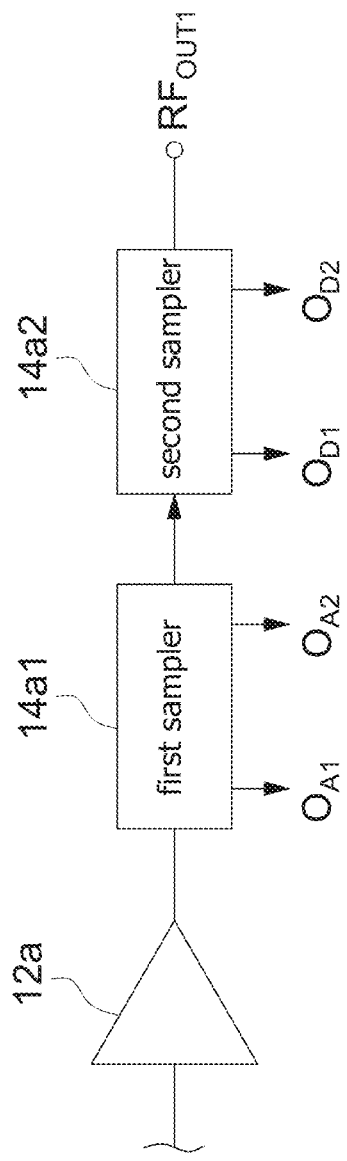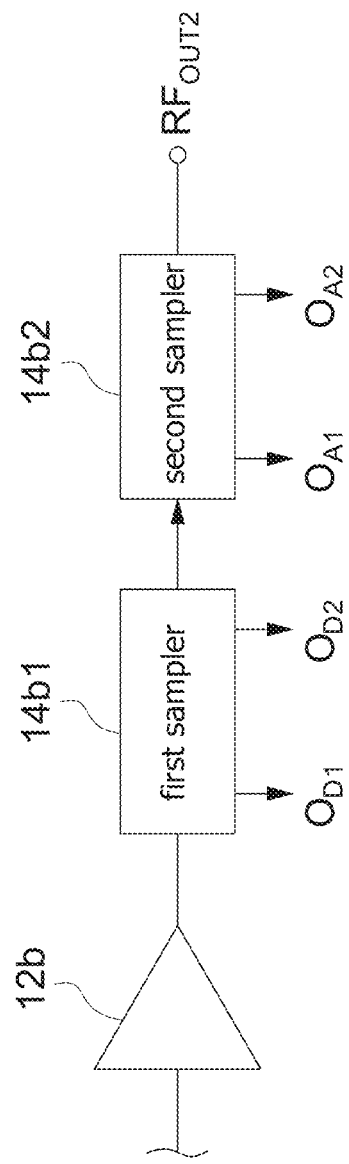

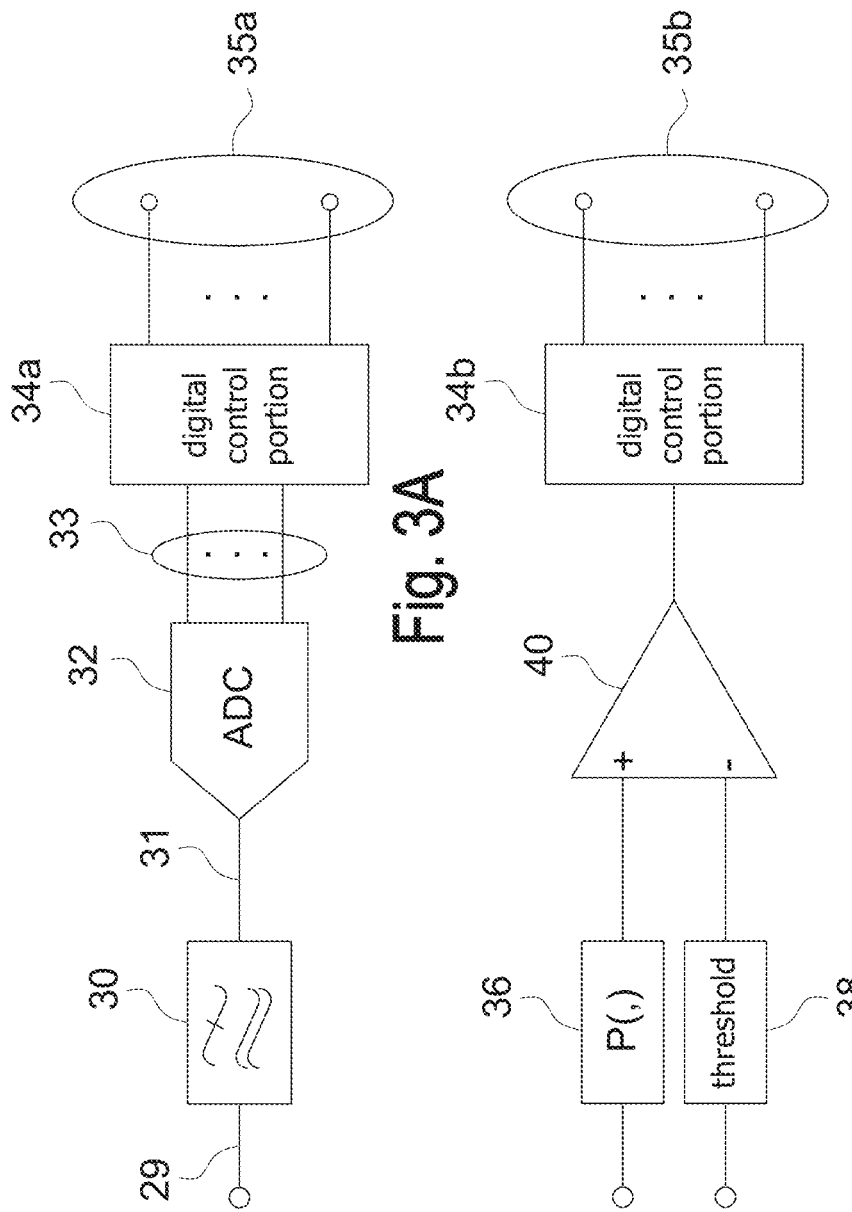

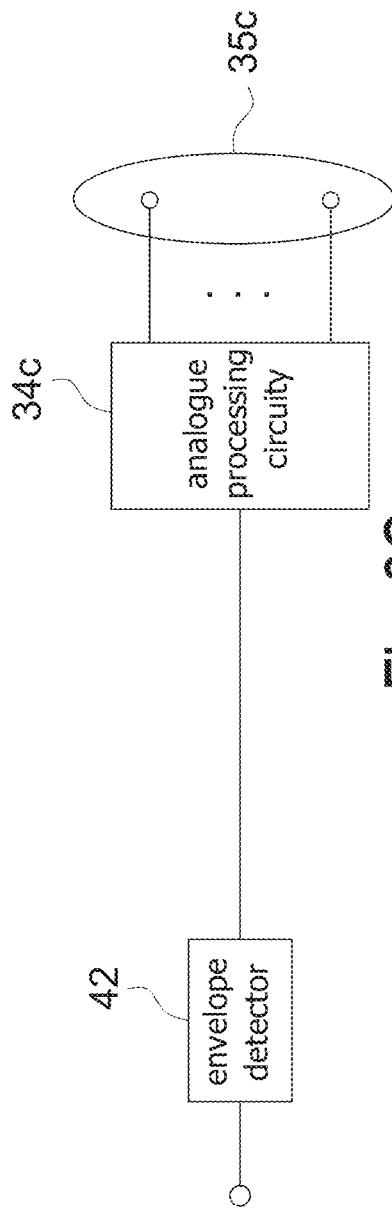
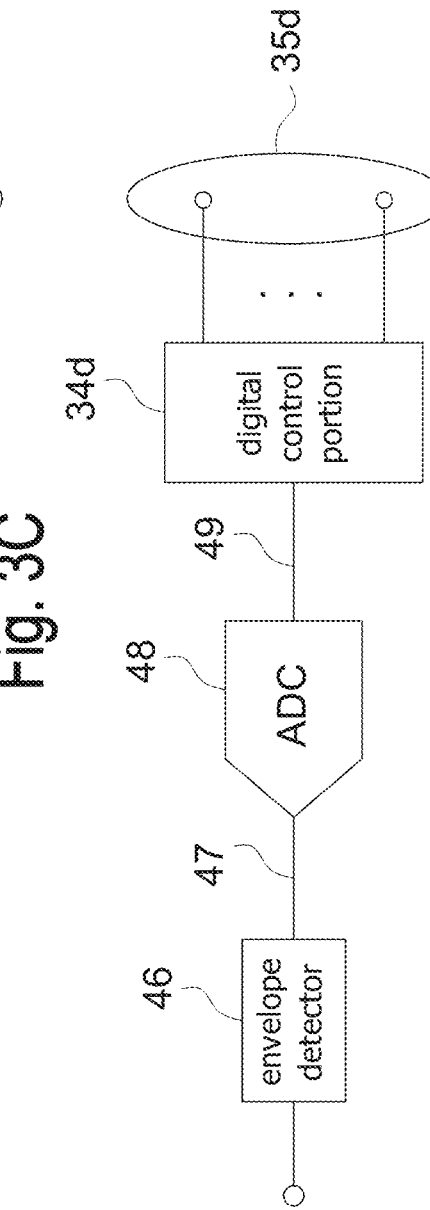

RF POWER GENERATOR WITH ANALOGUE AND DIGITAL DETECTORS

CROSS-REFERENCE TO RELATED APPLICATION

This application is a divisional application of U.S. patent application Ser. No. 17/015,139 filed Sep. 9, 2020, now issued as U.S. Pat. No. 11,705,314, which claims priority to European Patent Application No. 19196359.4 filed Sep. 10, 2019, the disclosures of each of which are hereby incorporated by reference in their entirety.

BACKGROUND OF THE INVENTION

Field of the Invention

The present disclosure relates generally to a generator, and a plasma processing system comprising the generator. Also disclosed is a method for operating a generator controller.

Description of Related Art

High-power RF generators used, for example, in semiconductor plasma processing applications are known. For example, U.S. Pat. No. 7,750,645 B2 concerns an approach for monitoring the degradation of plasma chamber consumables by monitoring arcing events, and proposes to detect arcing events in different parts of a plasma reaction chamber using a digital controller.

U.S. Pat. No. 8,264,237 B2 concerns an approach for monitoring plasma discharge events during a plasma manufacturing process. An RF generator is impedance-matched to a plasma chamber using an impedance matching network and an RF sensor. A signal from the RF sensor is converted by an analogue-to-digital converter and used as input for an analysis module. Digital signal processing techniques such as correlation of the digitized signal from the RF sensor enable the detection of arc events.

WO 2014/036169 A1 provides an arc management system having an energy storage device that, upon detection of an arc in a plasma load, applies a voltage to the plasma load at the opposite polarity to a usual polarity applied to the plasma load.

However, the systems described in the aforementioned documents can be further improved.

Accordingly, it is desirable to provide a generator control approach that can more effectively address arc events or other energy discontinuities in a plasma load, for example. Furthermore, other desirable features and characteristics of the present invention will become apparent from the subsequent detailed description of the invention and the appended claims, taken in conjunction with the accompanying drawings and the background of the invention.

SUMMARY OF THE INVENTION

According to a first aspect, there is provided a generator comprising an output configured to output an RF power signal, a signal generator to generate an RF input signal, an RF power stage which receives the RF input signal and generates an amplified RF power signal at its output, at least one sampler configured to sample the RF signal at the output of the RF power stage, a controller comprising a digital control portion and an analogue control portion, an analogue feedback path between the at least one sampler and the controller enabling an analogue signal representation of a signal from the at least one sampler to be provided to the controller, and a digital feedback path between the at least one sampler and the controller enabling a digital signal representation of the signal from the at least one sampler to be provided to the controller.

The controller is configured to adjust the RF signal at the RF output from a first state into a second state based on the analogue signal representation and/or the digital signal representation.

An effect is that the digital control portion provides high precision and, optionally, flexibility in software. The analogue control portion provides high dynamic range and a high speed response, which is important when suppressing sudden and unpredictable events like arcing events. The combination of both techniques results in high precision and flexibility, whilst enabling adequate control of unexpected fault conditions.

In embodiments, the at least one sampler comprises first and second samplers connected in cascade to the output of the RF power stage. The first sampler provides a pre-digitized signal for the digital feedback path and the second sampler provides the analogue signal representation from the at least one sampler to the analogue feedback path.

An effect is that precision is improved. The limited isolation of the splitters reduces the accuracy of the signals eventually used in the highly precise digital processing. Accordingly, an improvement in precision is observed when using different samplers for analogue and digital processing.

In embodiments, the at least one sampler comprises a first sampler connected to the output of the RF power stage, and the generator comprises a splitter connected to the output of the first sampler, wherein the splitter is configured to split the signal from the sampler and to provide a pre-digitized signal for the digital feedback path and the analogue signal representation to the analogue feedback path. Optionally, the first splitter provides forward RF signals or vector voltage signals for the analogue and digital path, depending on the type of sampler. The second splitter provides reflected RF signals or vector current signals for the analogue and digital path.

An effect is that a cost reduction is possible because only one sampler is necessary to provide the analogue and digital feedback paths.

In embodiments, the at least one sampler is configured to provide a forward RF signal and a reflected RF signal to the analogue feedback path and/or the digital feedback path. In embodiments, the at least one sampler is configured to provide a voltage signal and a current signal to the analogue feedback path and/or the digital feedback path.

An effect is that the analogue control portion and the digital control portion can more accurately monitor the impedance match when the forward RF signal and a reflected RF signal or voltage and current signals are available.

In embodiments, the at least one sampler is, or comprises, at least one directional coupler to determine forward and reflected signal or at least one VI probe to determine voltage and current signals.

In embodiments, the digital feedback path comprises at least one analogue-to-digital converter configured to generate the digital signal representation of the signal from the at least one sampler, preferably comprising a pre-analogue-to-digital converter filter. Optionally, the pre-analogue-to-digital converter filter is an anti-aliasing filter.

An effect is that information concerning the RF signal at the output such as amplitude, phase, and frequency can be provided with a high degree of accuracy to the digital control portion.

In embodiments, the digital signal representation is provided to the digital control portion of the controller.

In embodiments, the digital control portion of the controller is configured to acquire the digital signal representation, and to adjust the power of the input RF signal to RF amplifier(s) and/or a power supply voltage or current level based on the digital signal representation.

An effect is that the RF output of the generator can be accurately and flexibly controlled using the digital control portion. For example, the RF input signal's amplitude can be changed or the RF input's phase can be changed. Alternatively to, or in combination with the RF input signal, the DC power supply voltage level can be changed to affect the gain of the power stage, thus also controlling the RF output power.

In embodiments, the at least one analogue-to-digital converter is configured to oversample the signal from the at least one sampler by at least two samples per frequency cycle of the RF input signal generated by the signal generator to provide an oversampled signal.

An effect is that a higher resolution digital signal representation of the RF output can be provided to the digital control portion using a Nyquist-Shannon sampling theorem.

Optionally, the analogue control portion of the controller is configured to acquire the analogue signal representation, and to detect whether the signal at the output of the power amplifier represents a normal operating condition or a fault condition.

Optionally, the analogue control portion of the controller is configured to perform an analogue comparison of the analogue signal representation by comparing the analogue signal representation with thresholds defining a plurality of fault conditions, and wherein the analogue control portion of the controller is configured to adjust the RF signal at the RF output from a first state into a second state based on the result of the analogue comparison.

In embodiments, the digital control portion is configured to obtain a forward and/or reflected power measurement or voltage and/or current measurement and preferably a load impedance information using the oversampled signal.

In embodiments, the controller further comprises a digital to analogue converter controlled by the digital control portion of the controller, and the digital to analogue converter is configured to provide a control signal to the signal generator, and/or power amplifier and/or a DC power supply of the generator.

An effect is that the digital control portion can flexibly and accurately configure the RF generator based on at least the digital signal representation.

In embodiments, the controller further comprises a direct analogue control path between the analogue control portion and the power amplifier.

An effect is that the analogue control portion can rapidly, and with a high dynamic range, address a fault condition detected at the RF output of the generator.

In embodiments, the digital control portion of the controller is configured to acquire the digital signal representation, and to detect whether the signal at the output of the power amplifier represents a normal operating condition or a fault condition.

An effect is that the digital control portion can be flexibly reprogrammed to identify different fault conditions based upon the use or recipe of a specific plasma processing system.

In embodiments, the first state and/or the second state define an expected condition of the generator, and wherein the fault condition defines an arcing condition in a plasma chamber connected to the RF output of the generator.

In embodiments, the digital control portion of the controller is configured to perform a digital comparison of the digital signal representation by comparing the digital signal representation with stored digital signals defining a plurality of fault conditions, and wherein the digital control portion of the controller is configured to adjust the RF signal at the RF output from a first state into a second state based on the result of the digital comparison.

An effect is that it is possible to discriminate between a wide range of fault conditions based on their signatures, such as an arc condition in a plasma processing system, a short-circuit in the generator supply cable, a fault connector, and the like.

In embodiments, the analogue control portion of the controller is configured to bypass or to override the digital control portion.

An effect is that a digital control portion that is slower in response to a change in condition at the sampler can be bypassed, enabling, for example, the safe shutdown or gain reduction at the output of the power amplifier in response to a fault condition.

In embodiments, bypassing or overriding the digital control portion comprises causing the controller to adjust the RF signal at the RF output from the first state into the second state based only on the analogue signal representation if the digital control portion has not identified an abnormal operating condition and the analogue control portion has identified an abnormal operating condition.

In embodiments, the analogue control portion is configured to provide an interrupt signal to the digital control portion when bypassing or overriding the digital control portion.

An effect is that logic circuitry and optionally a computer implemented control circuit in the digital control portion can be quickly informed if the control of the digital control portion is bypassed or overridden, thus enabling a more secure re-entry to a normal operating condition.

In embodiments, the digital control portion of the controller is configured, upon receipt of the interrupt signal, to pause or to reduce the extent of digital control of the generator for a predefined time, or until a pause signal condition in the generator is met.

An effect is that the digital control portion does not take actions that might conflict with the action of the analogue control portion.

In embodiments, the digital control portion is configured to restore digital control of the controller upon cessation of the interrupt signal, or until a restore signal condition in the generator is met.

An effect is that when an unsafe fault condition has safely been addressed by the analogue control portion, the digital control portion can flexibly recover control of the generator.

In embodiments, the digital control portion comprises one or more of a microprocessor, an embedded processor or embedded computer, programmable logic, and/or a digital signal processor configured to receive the digital signal representation from the digital feedback path.

An effect is that the digital control portion can be programmed to address a wide range of plasma systems and manufacturing recipes.

In embodiments, the digital control portion comprises a first digital control element and a second digital control element. At least the second digital control element is configured to receive and to process the digital signal representation from the digital feedback path faster than the first digital control element, based on configuration settings of the second digital control element communicated by the first digital control element to the second digital control element, wherein the second digital control element is configured to override the first digital control element in a condition where the configuration settings are exceeded, and wherein the second digital control element is configured to adjust the RF signal at the RF output from the first state into the second state.

An effect is that a second digital control element is provided having a response time that is slower than an analogue control portion, but faster than a first digital control element.

In embodiments, the first digital control element is a microcontroller, microprocessor, or embedded computer, and wherein the second digital control element is a field programmable gate array (FPGA), a reconfigurable field programmable gate array, an application specific integrated circuit, or hard-wired logic.

In embodiments, the analogue control portion of the controller further comprises: a peak detector or envelope detector configured to receive the analogue signal representation and generate a peak-detection signal (or respectively an envelope detection signal), a threshold voltage generator preferably controlled by the digital control portion of the controller configured to generate a threshold voltage; and a first comparator configured to compare the peak-detection signal (or respectively an envelope detection signal) and the threshold voltage, and to generate a comparator output signal if the peak-detection signal (or respectively an envelope detection signal) exceeds the threshold voltage, or vice versa, wherein the comparator output signal is used as the interrupt signal.

An effect is that an exclusively analogue feedback path can quickly take control of the RF generator in a fault condition before a digital control system is able to react.

In embodiments, the analogue control portion of the controller further comprises: a first analogue output circuit configured to set a power of the RF output signal of the generator, wherein the first analogue output circuit is controlled by the analogue signal representation of the signal from the at least one sampler with reference to a power output threshold provided by the digital control portion.

In embodiments, the analogue control portion of the controller further comprises: a second analogue output circuit configured to set the amplifier bias of the RF output signal of the generator, wherein the second analogue output circuit is controlled by the analogue signal representation of the signal from the at least one sampler with reference to an amplifier bias threshold provided by the digital control portion.

In embodiments, the analogue feedback path comprises a more responsive critical path than the digital feedback path, wherein the analogue signal representation of the signal from the at least one sampler is digitized using a further analogue-to-digital converter and used by the digital control portion to provide mixed-signal arc detection.

Optionally, a generator is provided wherein the analogue control portion of the controller further comprises: a vector analogue signal processing circuit providing an analogue output signal, a peak detector or envelope detector configured to receive the analogue signal from the analogue signal processing circuit, a threshold voltage generator preferably controlled by the digital control portion of the controller configured to generate a threshold voltage; and a first comparator configured to compare the peak-detection signal (or respectively an envelope detection signal) and the threshold voltage, and to generate a first comparator output signal if the peak-detection signal (or respectively an envelope detection signal) exceeds the threshold voltage, or a second comparator output signal, wherein the first comparator output signal is used as an interrupt signal.

According to a second aspect, there is provided a plasma processing system comprising a generator according to the first aspect or its embodiments, and a semiconductor processing module configured to receive an RF signal from the generator.

According to a third aspect, there is provided a method for operating a generator, comprising:

generating, using an RF power stage, an RF output signal based on an RF input signal generated by a signal generator;

sampling, using at least one sampler, a radio frequency, RF, power signal at an output of the RF power stage or at the output of a power combining circuit combining power of at least two RF power stages;

generating a digital signal representation of the signal from the at least one sampler and providing the digital signal representation to the controller via a digital feedback path between the at least one sampler and the controller;

generating an analogue signal representation of a signal from the at least one sampler and providing it to the controller via an analogue feedback path between the at least one sampler and the controller, wherein one or both of the digital control portion and the analogue control portion are configured to control at least the power amplifier, the switching-mode power RF source, the signal generator and/or the DC power supply;

adjusting, using the controller, the RF power at the RF output from a first state into a second state based on the analogue signal representation and/or the digital signal representation.

In this application, the term "RF power stage" means either an RF power amplifier in the traditional sense of class A, B, AB or enhanced F, F-inverse, J, J-inverse amplifiers or a non-amplifying power stage like a switch mode RF circuit such as class D, E, S "amplifier" topologies. The power stage generates the high power signal to be provided at the output of an RF power generator. RF power generators for plasma applications such as plasma deposition and plasma etching for the semiconductor manufacturing industry typically have to provide more than 500 W power, preferably more than 1 kW power and most preferably more than 2.5 kW power at their output. The RF power signal is typically sampled in order to detect anomalies and/or to provide feedback to a controller of the RF generator. The controller may then send corrective measures to either the power stage or to other sub-parts of the RF generator in order to adjust the RF power signal. Other sub-parts of the power generator may include a DC voltage supply (which itself may comprise for example a rectifier followed by smoothing the rectified signal to achieve a DC voltage from the AC mains supply and a DC/DC converter), a signal generator (this is a low-power signal generation preceding the power stage), a pre-amplifying stage (also preceding the power stage), and may also include various other sub-parts.

In this application, the term "sampler" means an electronic component for connection to, for example, the RF output of an RF power stage of a generator. The sampler is capable of providing a signal representative of the condition at the RF output of the generator to the analogue or digital control portions. In particular, the sampler may be a directional coupler (unequal directional power splitter; separating and coupling a known fraction of the forward and reflected wave) implemented for example as a mechanical part or on a PCB as coupled line coupler or lumped element coupler or a combination of both; or the sampler may be a Voltage-Current probe, so called VI probe. A directional coupler or a VI probe is typically a reciprocal device characterized by a centre frequency and range of operation, coupling, isolation/directivity, insertion loss, and the like. More than one sampler may be connected in cascade. A sampler enables the controller to obtain measurements of forward wave into and reflected wave from, or voltage on and current into a connected device such as a plasma processing system, for example.

In this application, the term "controller" defines an electronic circuit of an RF generator that is capable of monitoring the generator, in particular the RF power output of the generator, and implementing control changes to the generator in response to the monitored RF power output. The controller is a mixed-signal circuit, or a fully digital circuit, comprising at least one digital feedback path and at least one analogue feedback path. The controller may be located on the same, or across different circuit boards.

In this application, the term "analogue feedback path" defines an analogue circuit capable of transmitting a steady-state or time-varying representation of the state of the RF power output, such as the forward and/or reflected voltage wave or voltage and current, from a sampler to, for example, low-level signal generator, the power amplifier gain or power supply control. The analogue feedback path does not pass through any digital components. However, a comparator may be considered to be part of an analogue feedback path even though it outputs two output levels, provided no digital processing of the comparator signal occurs subsequently to the comparator. A significant characteristic of the analogue feedback path is response speed. For example, commercial and cost-efficient integrated comparators have time response down to several ns. Of course, more complicated analogue processing such as logarithmic amplification, multiplication, envelope detection, and peak detection can be designed into the analogue feedback path.

In this application, the term "digital feedback path" defines a digital circuit capable of transmitting a digitally sampled representation of the state of the RF power output, such as the forward and/or reflected voltage wave or voltage and current, from a sampler to, for example, the low-level signal generator, power amplifier gain or power supply control. Typically, the digital feedback path comprises an analogue-to-digital converter connected to the sampler (preferably via an aliasing filter). Thus, the state of the RF power output can be processed using digital signal processing techniques by an embedded processor, a microprocessor, or a digital signal processor executing a suitable program, reconfigurable or non-reconfigurable logic, and the like. This enables sophisticated RF generator control algorithms to be applied based upon the detected RF state.

In this application, the term "first state" and "second state" as applied to the adjustment of the RF power output by the controller embraces a wide range of potential changes that could be implemented by the controller. In view of the need to protect the RF power stage from damage and in view of the need to protect the processing substrate of the application from damage (for example a semiconductor wafer in a plasma processing chamber), such a change may advantageously be performed exclusively by the analogue control portion overriding the digital control portion of the controller. Another example of changing from a "first state" to a "second state" refers to a moderate variation in the applied RF power, for example by 10% or 20% greater or lower than a time-based average level. Furthermore, such a gradual change could be programmed to occur over several seconds or even a minute as part of a response to a plasma manufacturing "recipe". As such, a digital control portion of the controller can accurately and flexibly perform such a state change. Optionally, the digital controller is configured to protect the generator against thermal damage, and the analogue controller is configured to protect the generator and connected equipment against arcing and/or to protect the processing substrate of the application against arcing.

BRIEF DESCRIPTION OF THE DRAWINGS

The present invention will hereinafter be described in conjunction with the following drawing figures, wherein like numerals denote like elements. In the electrical schematic drawings, a convention is applied that signal lines joined by a "dot" are electrically connected nodes, whereas signal lines that merely cross with no "dot" are not electrically connected nodes. As a further convention in the electrical schematic drawings, the triangular symbol of an amplifier is used to represent an amplifier or a combination of amplifiers or indeed any "amplifying" topology, hereafter called RF power stage, known to those skilled in the art to achieve an RF power signal. For an "RF power stage" the usual convention that the high power is output at an apex of the triangular symbol, while the other signal lines such as AC input signal, DC voltage supply and control signal(s) are connected to the faces of the triangular symbol remain valid. It is understood that in its most simple variant, the power stage is an amplifier.

FIGS. 2A, 2B, and 2C are schematic block diagrams illustrating optional sampler architectures.

FIG. 3A is a schematic block diagram illustrating signal conversion circuit.

FIG. 3B is a schematic block diagram illustrating a peak detector circuit.

FIG. 3C is a schematic block diagram illustrating an envelope detector circuit.

FIG. 3D is a schematic block diagram illustrating an analogue-to-digital signal processing.

DESCRIPTION OF THE INVENTION

The following detailed description is merely exemplary in nature and is not intended to limit the invention or the application and uses of the invention. Furthermore, there is no intention to be bound by any theory presented in the preceding background or the following detailed description.

RF Generators used to generate RF plasmas in plasma processing systems are optionally configurable to react to fault conditions at their RF outputs. For example, a fault condition inside a connected plasma reaction chamber could lead to a surge in reflected power back to the generator and could damage it.

Figure 1:
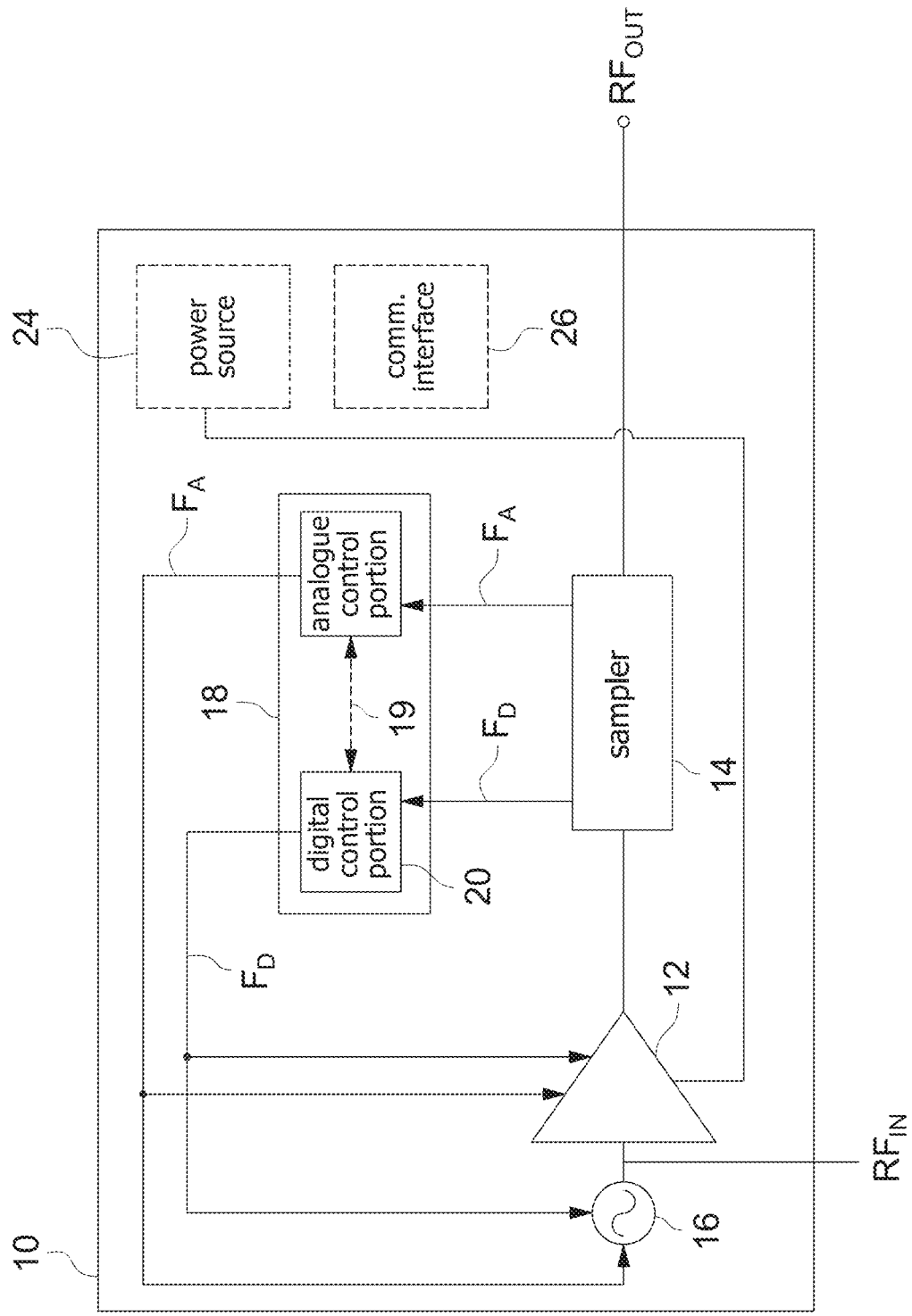
FIG. 1 is a schematic block diagram illustrating a generator according to the first aspect.

FIG. 1 illustrates a generator 10 according to the first aspect. The generator comprises a power amplifier 12, at least one sampler 14 configured to sample a radio frequency, RF, signal $RF_{OUT}$ at an output of the power amplifier 12, an RF output configured to output an RF signal from the generator 10, a signal generator 16 configured to generate an RF input signal $RF_{IN}$ and to provide the RF input signal to the power amplifier 12. Furthermore, a controller 18 is provided comprising a digital control portion 20 and an analogue control portion 22, wherein one or both of the digital control portion 20 and the analogue control portion 22 are configured to control at least the power amplifier 12 and/or the signal generator 16. In practice, this control is achieved by varying the power supply of the power amplifier and/or the input signal level. While a single power amplifier 12 is shown in FIG. 1, it is possible to have a cascade of power amplifiers (series arrangement). The power amplifier 12 can thus be a more complex structure, a so-called power stage, which can be any known amplifier topology known to those skilled in the art in order to generate the high power characteristic of the output signal.

It will be appreciated that the generator may comprise an external or internal power supply 24 such as an AC to DC power source. Optionally, an interface circuitry 26 enables the generator 10 to be connected to a system of generators, or a control system, via a digital control protocol such as RS-232, Profibus™ or CANBUS™, Ethernet, or other communication protocols known in the art.

Therefore, an analogue feedback path $F_A$ comprising at least one analogue signal, and preferably two signals representing forward and reflected power, or voltage and current between the at least one sampler 14 and the controller 18 enables an analogue signal representation of a signal from the at least one sampler 14 to be provided to the controller 18. Furthermore, a digital feedback path $F_D$ comprising at least one digital signal, and preferably two signals representing forward and reflected power, or voltage and current between the at least one sampler 14 and the controller 18 enables a digital signal representation of the signal from the at least one sampler 14 to be provided to the controller.

The controller 18 is configured to adjust the RF signal at the RF output $RF_{OUT}$ from a first state into a second state based on the analogue signal representation and/or the digital signal representation.

The digital control portion 20 of the controller receives a digital signal representation of the signal from the sampler 14 generated, for example, by an analogue-to-digital converter (not shown in FIG. 1). The signal from the sampler 14 is optionally filtered using an anti-aliasing filter (not shown) prior to analogue-to-digital conversion. The digital control portion 20 may comprise an embedded computer or processor, a microprocessor, digital signal processor, programmable or non-programmable logic, and the like. The digital control portion 20 is configured to receive the digital signal representation $F_D$ from the sampler 14 side of the digital feedback path and to perform a digital comparison or measurement. For example, the digital control portion 20 is configured to compare, using digital arithmetic, the magnitude of the digital signal representation to a look-up table of values. If the magnitude of the digital signal representation is too high compared to a reference value in the look-up table, the digital control portion 20 applies an attenuation coefficient to a digital feed-forward signal to control other components of the generator such as the signal generator 16 and/or the gain of the RF path or supply voltage of the power amplifier 12.

A look-up table is a computationally simple and therefore rapid way of performing the digital comparison. Of course, more advanced digital signal processing or filtering techniques can be applied to the signal in the digital feedback path by the digital control portion 20 to give high precision and software reprogrammability.

Optionally, the digital control portion 20 is configured to adjust a power supply of the power amplifier 12 and to derate the power supply according to user requirements and digital feedback from the sampler 14 stored in the digital control portion 20 in order to protect the generator and/or to protect the processing substrate of the application.

Optionally, the digital control portion 20 is configured to identify an arcing condition or a pre-arcing condition. Some arcs in a plasma semiconductor manufacturing system provide tell-tale advanced signs that are detectable at the RF output of a generator, for example a change in the forward and/or reflected power, and the example fault condition signals indicating these may be saved into the digital control portion 20. Optionally, the digital control portion is configured to digitally correlate, or identify, a fault condition of the digital feedback signal and adjust a setting of the generator to prevent a fault from occurring or to make it less severe by altering the setting of the generator from a first state to a second state in advance of the fault developing. Further architectures for the digital control portion will be discussed subsequently.

In embodiments, the analogue control portion 22 is configured to directly obtain a steady-state or time-varying signal from sampler 14 as the analogue signal representation. Optionally, the analogue signal representation is filtered to remove higher harmonics and/or to compensate for the frequency response of the sampler 14. The analogue control portion 22 is configured to directly control settings of the generator 10 using the analogue feed forward path $F_A$. The analogue control portion 22 is configured to override the digital control portion 20 in specific conditions to be discussed subsequently. For example, when a damaging fault condition is present at the sampler 14, and it is detected that the digital control portion 20 is too slow to protect a connected process module against, the analogue control portion adjusts the settings of the generator 10, for example the gain and/or power supply of the power amplifier 12 and/or the signal generator 16 to protect the generator and/or the processing substrate of the application (in other words, the analogue control portion can also adjust the RF signal at the RF output from a first state into a second state independently of the condition of the digital control portion 20).

In other words, the analogue feedback path $F_A$ is a parallel and independent communications path to the digital feedback path $F_D$.

Optionally the digital control portion 20 and the analogue control portion 22 are bidirectionally or unidirectionally connected by communication link 19. As an example, the digital control portion 20 may monitor an analogue interrupt flag generated by the analogue control portion 22 over the unidirectional link 19. Alternatively, the digital control portion 20 may switch one of a plurality of different analogue control portions 22 into action via a unidirectional link 19 to enable a different analogue control response of the controller. Optionally, the link 19 is bidirectional, enabling both functionalities to be performed.

The signal generator 16 is configured to generate RF frequency signals at, for example, 13 MHz or other frequencies applicable, for example, in plasma processing systems. The signal generator 16 may vary one or more of the amplitude, phase, frequency, or harmonic content of the generated signal upon control by the controller. The signal generator 16 may be configured to generate trivial waveforms such as a sine wave, or may be programmed to generate harmonically complex signals or signal bursts for application to advanced plasma semiconductor manufacturing recipes.

In the case that the digital control portion 20 is provided as an embedded processor, microprocessor, digital signal processor, or the like, a computer program element comprising instructions which, when executed by the embedded processor, microprocessor, digital signal processor, or the like, cause the digital control portion 20 to perform the functions of the digital control portion 20. Of course, the digital control portion may be provided exclusively as hard-wired digital logic, in which case a computer program element comprising instructions is not required.

In operation, the generator 10 is connected to an external load, such as a plasma processing system. The generator is connected to a power source 24 which can be a DC power source and is also connected to initial control instructions provided via an on-board control interface (not shown in FIG. 1) and/or the external communications interface 26. The generator 10 applies RF power to an external load in a first state (safe state). The sampler 14 provides a digital signal representation of the signal measured at the sampler to the digital control portion 20 of the controller 18. The sampler 14 provides an analogue signal representation of the signal measured at the sampler to the analogue control portion 22 of the controller 18. If the digital control portion 22 identifies that the digital signal representation indicates that the RF output is entering, or approaching, a fault condition, it controls components of the generator 10 via the digital feedback path $F_D$ to prevent the fault condition from occurring, or to ameliorate it. In particular, the digital control portion 20 adjusts the RF signal at the RF output from a first state into a second state based on the digital signal representation. However, in operation a case may occur when the digital control portion 20 is too slow to identify a fault condition at the sampler 14. In this case, the analogue control portion 22 of the controller detects the fault condition before the digital control portion 20 and adjusts the RF signal at the RF output from the first state into the second state based on the analogue signal representation.

Figure 2C:
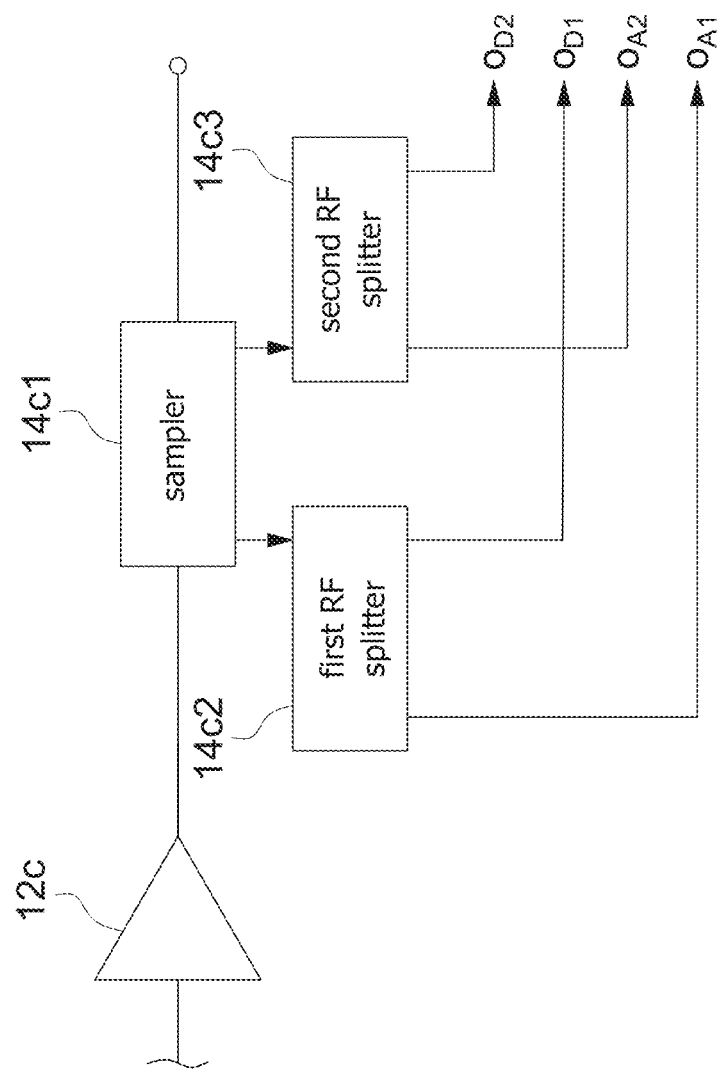

It will be appreciated that the first aspect discusses the switching of the RF output from a first state to a second state, and that in its simplest form this term may cover, for example, merely switching off the output from the RF amplifier. However, the term embraces a wide range of possibilities. For example, a gradual change in gain or power supply level causing a more gradual change in RF output level qualifies as a change from a first state to a second state. Furthermore, a change in signal phase or harmonic content qualifies as a change from a first state to a second state. FIGS. 2A-2C illustrates three optional configurations for the sampler 14.

FIG. 2A illustrates a power amplifier 12a having an output connected to a sampler 14 comprising a first $14_{a1}$ and a second $14_{a2}$ sampler. The first sampler $14_{a1}$ provides one or more output signals $O_{A1}$, $O_{A2}$ to an analogue feedback path $F_A$. Two analogue output signal paths $O_{A1}$, $O_{A2}$ are illustrated in FIG. 2A, and these may provide, for example, a single differential analogue signal representing the forward power or reflected power, or dual single-ended signal lines of two analogue signals, for example forward power and reflected power. Therefore, an analogue signal representation is provided by sampler $14_{a1}$.

The second sampler $14_{a2}$ provides digital path signals $O_{D1}$ and $O_{D2}$. Initially the digital path signals $O_{D1}$ and $O_{D2}$ from the second sampler $14_{a2}$ are analogue signals, and are digitized using an analogue-to-digital converter (not shown). Digital path signals $O_{D1}$ and $O_{D2}$ may represent a single differential signal of either forward or reflected power, or alternatively single-ended signals of forward and reflected power at RF output $RF_{out1}$. In a non-illustrated embodiment, digital path signals $O_{D1}$ and $O_{D2}$ may be dual differential signals representing forward and reflected power. A wide number of further signal lines can be provided and those illustrated are for exemplary purposes. For example, dual differential signal lines providing a measurement of the forward power and/or reflected power from the sampler 14. Therefore, a pre-digital signal representation is provided by sampler $14_{a2}$. The pre-digital signal representation is converted using an analogue-to-digital converter (not shown) into a digital signal representation.

The first $14_{a1}$ and second $14_{a2}$ samplers are designed with a coupling across the relevant operating frequency range of the generator that is small enough to enable the signal measured by the first sampler at the output of the power amplifier 12a and the signal measured at the RF output $RF_{out1}$ to differ in magnitude by a negligible amount. Subsequently, the dynamic range, response speed, linearity, phase shift, and other factors of the analogue and digital feedback paths are defined by the analogue or digital electronics used to implement the respective paths.

FIG. 2B illustrates a power amplifier 12b having an output connected to a sampler 14 comprising a first $14_{b1}$ and a second $14_{b2}$ sampler. The first sampler $14_{b1}$ provides one or more output signals $O_{D1}$, $O_{D2}$ to digital feedback path $F_D$. The second sampler $14_{b2}$ provides one or more analogue output signals $O_{A1}$, $O_{A2}$ to analogue feedback path $F_A$. A wide number of further signal lines can be provided and those illustrated are for exemplary purposes. For example, dual differential signal lines providing a measurement of the forward power and/or reflected power from the sampler 14 are provided. The order arrangement of samplers at the RF output $RF_{OUT2}$ in a particular order is, therefore, not essential. Of course, any number of additional samplers may be provided to the arrangement of FIGS. 2A and 2B to provide additional feedback signals.

FIG. 2C illustrates an alternative sampler architecture, which uses one sampler $14_{C1}$ connected to the output of the power amplifier $12_C$. An output of the sampler $14_{C1}$ is connected to the RF output $RF_{OUT3}$. A first RF splitter $14_{C2}$ splits the sampled RF signal and provides it as analogue output signal $O_{A1}$ and (through an analogue-to-digital converter ADC) also as a digital output signal $O_{D1}$. A second RF splitter $14_{C3}$ splits the sampled RF signal and provides it as analogue signal $O_{A2}$ and (through another ADC) also as digital output signal $O_{D2}$. Although the use of splitters potentially reduces the isolation between the channels output by the first and second RF splitters, this architecture may nevertheless enable a cost reduction.

FIG. 3A illustrates a digital signal processing chain for obtaining a digital signal representation from the sampler 14. The function of the digital signal processing chain is to convert the continuously varying analogue signal from the sampler 14 into a discrete numerical representation of the continuously varying analogue signal. An input signal 29 from the sampler 14 is optionally filtered by an anti-aliasing filter 30. The optionally filtered signal 31 is input to analogue-to-digital converter 32 (ADC). Many types of ADC can be used dependent on the performance constraints of the RF generator and specified requirements of the digital control portion, for example, a direct conversion ADC, a delta-encoded ADC, a sigma-delta ADC, and other topologies known to a skilled person. The ADC provides a digitized representation of the signal output from the sampler as a digital word 33 for transmission along the digital feedback path $F_D$ (optionally transmitted in serial or parallel). The digital control portion 34a receives the digitized representation. The digital control portion 34a is configured to provide a range of processing to output a control signal 35a such as one or more of an amplifier bias control, amplifier power supply control, signal generator output level control, and the like. Furthermore, the digital control unit 34a may communicate operating parameters of the generator to external interface circuitry 26.

As noted previously, the digital control portion 34a of the controller 18 is implemented as an embedded computer, an embedded microprocessor, fixed or programmable logic (such as an FPGA), a digital signal processor, or a combination of such devices dependent on the nature of the computation or signal processing to be performed by the digital control portion 34a. If the digital control portion 34a is required only to adjust the RF signal at the RF output from a first state into a second state using a coarse response (such as suddenly dropping the RF amplifier power when a fault condition is detected) then relatively primitive logic can be used. Alternatively, if the digital control portion 34a is required only to adjust the RF signal at the RF output from a first state into a second state based on complicated digital signal processing then a digital signal processor or embedded microprocessor is required.

FIGS. 3B-3D illustrate optional circuits that may be used in, or as, the analogue control portion.

FIG. 3B illustrates a peak detector 36 as an input to analogue control circuitry 35b. The function of a peak detector 36 is to obtain a continuously varying analogue signal from the sampler 14, and to retain the highest value of that signal (optionally over a given time window). Thus the peak detector 36 may be implemented as a diode/RC network with a suitable time constant. The output of the peak detector 36 is provided as a first input to a comparator 40. The comparator 40 is connected to digital control portion 34b. A fixed threshold 38 is provided as a second input to a comparator 40. As an example, when a peak is detected that is below the fixed threshold 38, the output of the comparator is "low" or "negative" indicating a condition not met. When a peak is detected that is at or above the fixed threshold 38, the output of the comparator is "high" or "positive" indicating a condition is met. This quasi-analogue signal is provided as a direct output signal 35b to, for example, low-level signal generator 16 control, amplifier bias control, or amplifier power supply control. Optionally, the direct output signal may be provided as an input to the digital control portion 20 (as an interrupt flag, for example). This enables a digital control portion to adapt its processing based on the output of the peak detector.

FIG. 3C illustrates an envelope detector 42. Optionally the envelope detector 42 is a logarithmic detector. The function of an envelope detector is to follow a relatively high frequency signal (such as the RF output signal) and to track its amplitude over a lower time interval. An envelope detector may, for example, be implemented with an RC network. The output of the envelope detector 42 is input into analogue processing circuitry 34c and may be provided as a direct output signal 35c to, for example, low-level signal generator 16 control, amplifier bias control, or an amplifier power supply control.

FIG. 3D illustrates an example of mixed-signal processing. Envelope detector 46 is connected to the sampler 14 and provides an envelope signal 47 of the sampled signal. ADC 48 provides a digital signal 49 representing the analogue value of the envelope to a digital control portion 34d. Output signal 35d may be provided to, for example, low-level signal generator 16 control, amplifier bias control, or an amplifier power supply control.

A skilled person will appreciate that many analogue interface circuits can be used to provide the analogue feedback path. In a generator according to the first aspect, at least one portion of the analogue feedback path is directly connected to the RF amplifier and/or the signal generator, or optionally a circuit breaker (RF switch) and is configured to adjust the RF signal at the RF output from a first state into a second state based on the analogue signal representation. In other words, the analogue feedback path bypasses the digital control portion.

Figure 4:
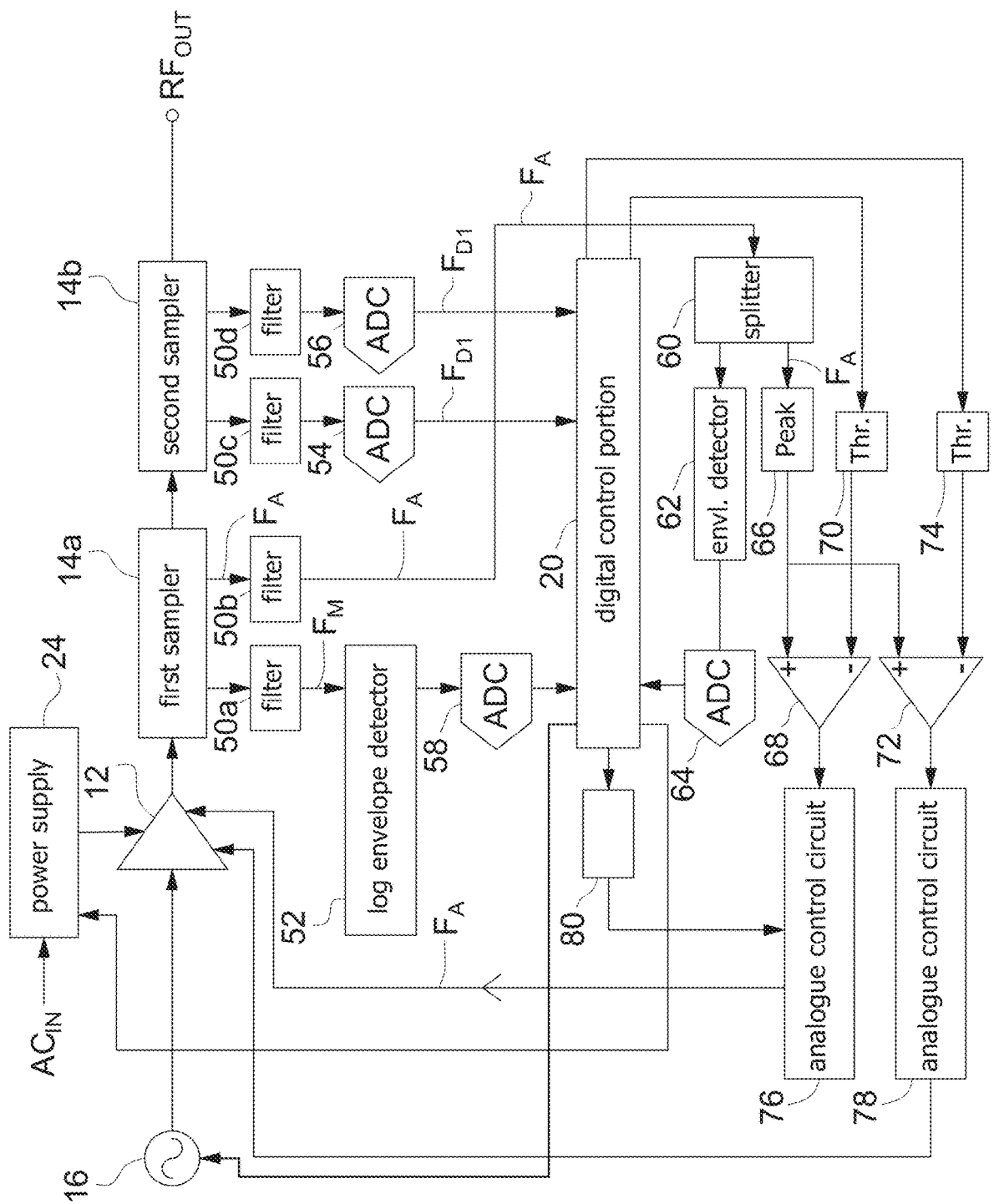
FIG. 4 is a schematic block diagram illustrating a mixed signal generator control according to embodiments described herein.

FIG. 4 provides a specific example of a generator according to an embodiment of the first aspect.

As shown in FIG. 4, a generator signal chain comprising a signal generator 16 as an input to a power stage 12 is provided. Power supply 24 powers the generator (and power amplifier). The output of the power amplifier 12 passes through a sampler 14 (comprised of a first sampler 14a and a second sampler 14b).

First sampler 14a is the first node of an analogue feedback path $F_A$. Optionally, first sampler 14a provides a mixed-signal feedback path $F_M$ comprising, for example, a filter 50a, a log envelope detector 52, an ADC 58, providing an input into digital control portion 20. In other words, the log envelope detector 52 performs analogue signal processing such as signal dynamic range compression prior to digitization by the ADC 58.

Second sampler 14b is the first node of a digital feedback path $F_D$, $F_{D1}$, $F_{D2}$. In this example, the digital feedback path comprises digital feedback path $F_{D1}$ defining forward power, and $F_{D2}$ defining reflected power at $RF_{OUT}$. ADCs 54 and 56 digitize the forward power and reflected power signals from second sampler 14b, via anti aliasing filters $50_c$ and $50_d$, and provide them as first and second digital signal representations to digital control portion 20.

A splitter 60 receives the analogue signal representation from the analogue feedback path $F_A$. In this example, a first branch of the analogue feedback path provides the analogue signal to a further log envelope detector 62, ADC 64, and into digital control portion 20. The second branch of the analogue feedback path $F_A$ is input to peak detector 66. The peak detector 66 provides a first input to first comparator 68 and second comparator 72. First threshold unit 70 and second threshold unit 74 provide first and second threshold levels as pre-sets from the digital control portion 20 into respective inputs of the first and second comparators 68, 72.

A first fast analogue control circuit 76 takes its input from the first comparator 68, and optionally from digital control portion 20 via digital to analogue converter (DAC) 80. The function of the first fast analogue control circuit 76 is to control the RF output level of power amplifier 12.

A second fast analogue control circuit 78 takes its input from the second comparator 72. The function of the second fast analogue control circuit 76 is, for example, to control the bias level of power amplifier 12.

Therefore, it is seen that a direct analogue feedback path exists between the first sampler 14a and the power amplifier 12 control. The path comprises filter 50b, splitter 60, peak detector 66, first comparator 68, and the analogue control circuitry 76. The path provided via splitter 60, log envelope detector 62, and ADC 64 functions, for example, as a digital control circuit interrupt flag based on the analogue signal representation.

The circuit of FIG. 4 is very flexible, comprising a separate directional coupler as a directional coupler for the digital signal path, a separate directional coupler as a pick-up for the analogue signal path. An RF splitter 60 in the analogue signal path $F_A$ enables the optional parallel provision of a plurality of analogue processing techniques. High precision digital signal processing optionally controls at least the generation of the low-level RF signal input into power amplifier 12 and the amplifier voltage. Optional high dynamic range mixed signal processing controls the low-level RF signal input into power amplifier 12. Optionally, two comparators 68, 72 are provided, one for fast arc management and one for fast amplifier protection and/or fast protection of the processing substrate of the application.

Optionally, the analogue and digital feedback paths may be protected from the high-power RF output using circuit protection or isolation. For example, galvanic isolation can be provided using optoisolators (not shown).

Figure 5:
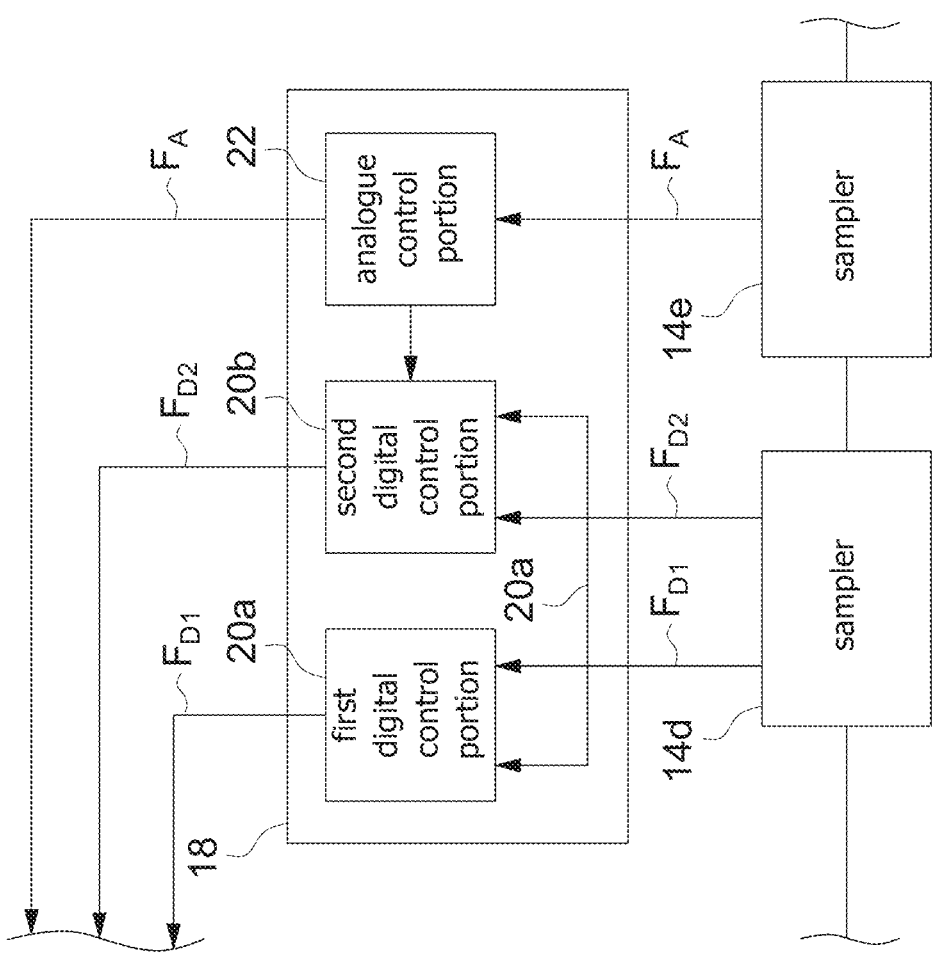
FIG. 5 is a schematic block diagram illustrating a variation of a controller having first and second digital control portions, and an analogue control portion.

FIG. 5 illustrates a developed generator control topology as an embodiment of the first aspect. The controller 18 comprises an analogue control portion 22, a first digital control portion 20a, and a second digital control portion 20b. The analogue control portion receives its input from sampler 14e. The first and second digital control portions receive their digital inputs from sampler 14d. Effectively, first $F_{D1}$ and second $F_{D2}$ digital feedback paths provide copies of the digital signal representation to first digital control portion 20a, and a second digital control portion 20b, respectively. However, the first digital control portion 20a is implemented using, for example, an embedded computer, microprocessor, or digital signal processor. The second digital control portion is implemented using, for example, hard-wired logic, a field programmable gate array or EEPROM, or a field programmable gate array with a reconfigurable portion. The effect of this is that the second digital portion has a much lower response time than a program executing on an embedded processor in the first digital control portion 20a (on the order of microseconds or milliseconds). The first digital control portion 20a is used to configure the second digital control portion using a configuration interface 21.

The second digital control portion 20b may be configured to adjust the RF signal at the RF output from a first state into a second state based on the digital signal representation $FD_2$. Optionally, the second digital control portion 20b is configured to monitor the analogue control portion 22 via interface 23.

An effect of this is that a fast logic circuit that is partially reprogrammable or configurable, such as a field programmable gate array, may be used to control a generator during fault states benefitting from a trade-off between a slow digital processor and a relatively inflexible analogue circuit.

Figure 6:
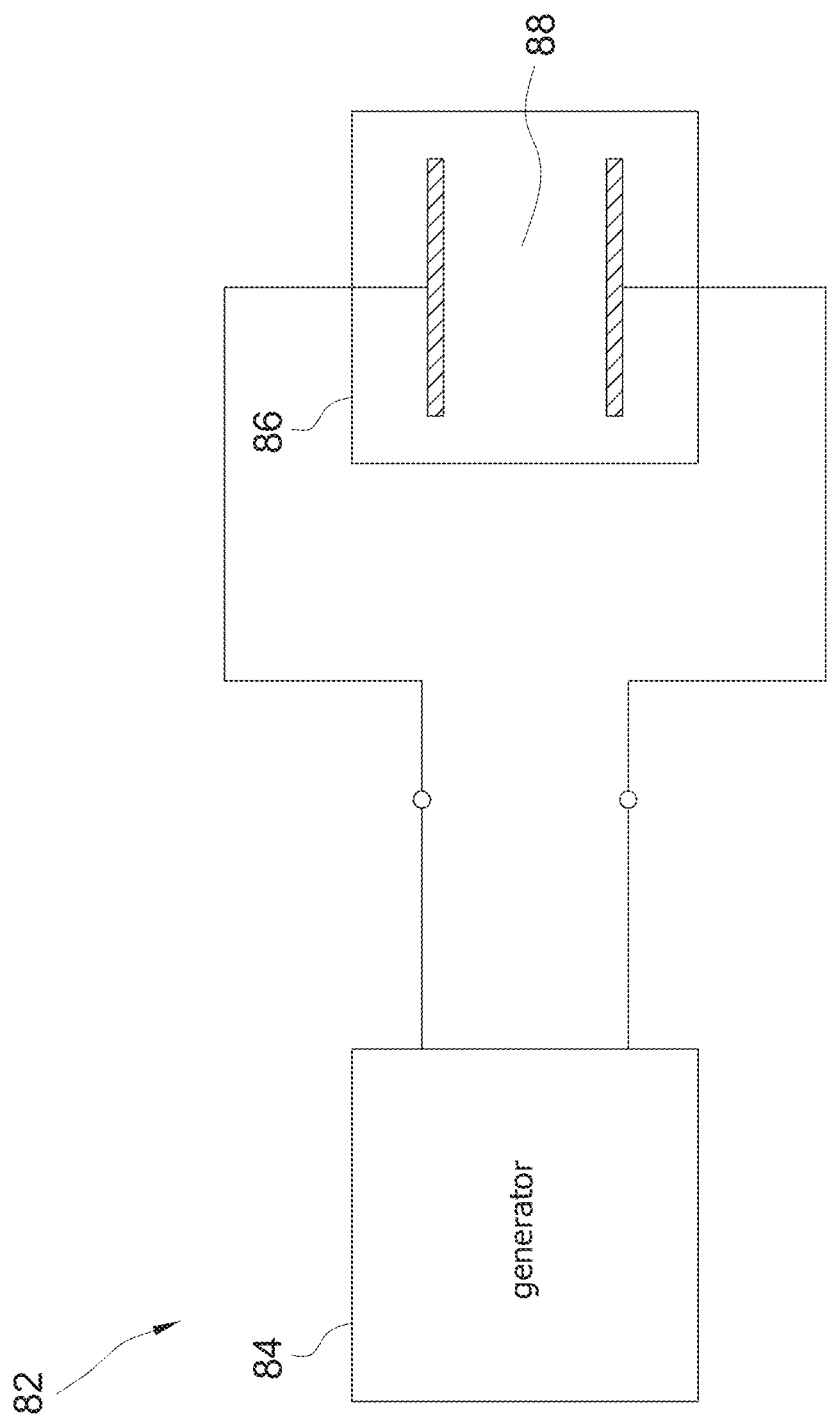
FIG. 6 schematically illustrates a system according to the second aspect.

FIG. 6 illustrates a plasma processing system 82 according to the second aspect comprising a generator 84 according to the first aspect or its embodiments discussed above, and a semiconductor processing module 86 configured to receive an RF signal from the generator.

The semiconductor processing module comprises a plasma chamber 88 for plasma processing (plasma etch, or plasma deposition) of, for example, a silicon wafer. Thus, the plasma chamber is a gas-tight module capable of containing a processing gas in the vicinity of a silicon wafer. The plasma chamber is typically provided with a sealable aperture capable of mating with a substrate/wafer transport system (not shown). First and second electrodes are provided at appropriate locations in the chamber. The first and second electrodes are connected to the generator 84, optionally by means of an intermediary impedance matching network (not shown). The connection includes a high-power coaxial connector and/or busbar, for example. When the RF generator generates an RF power signal and it is provided to the electrodes of the semiconductor processing module, the high-power RF signal induces a rapidly varying electric field in-between the first and second electrodes, which in the presence of an appropriate process gas enables a processing plasma to be formed.

Figure 7:
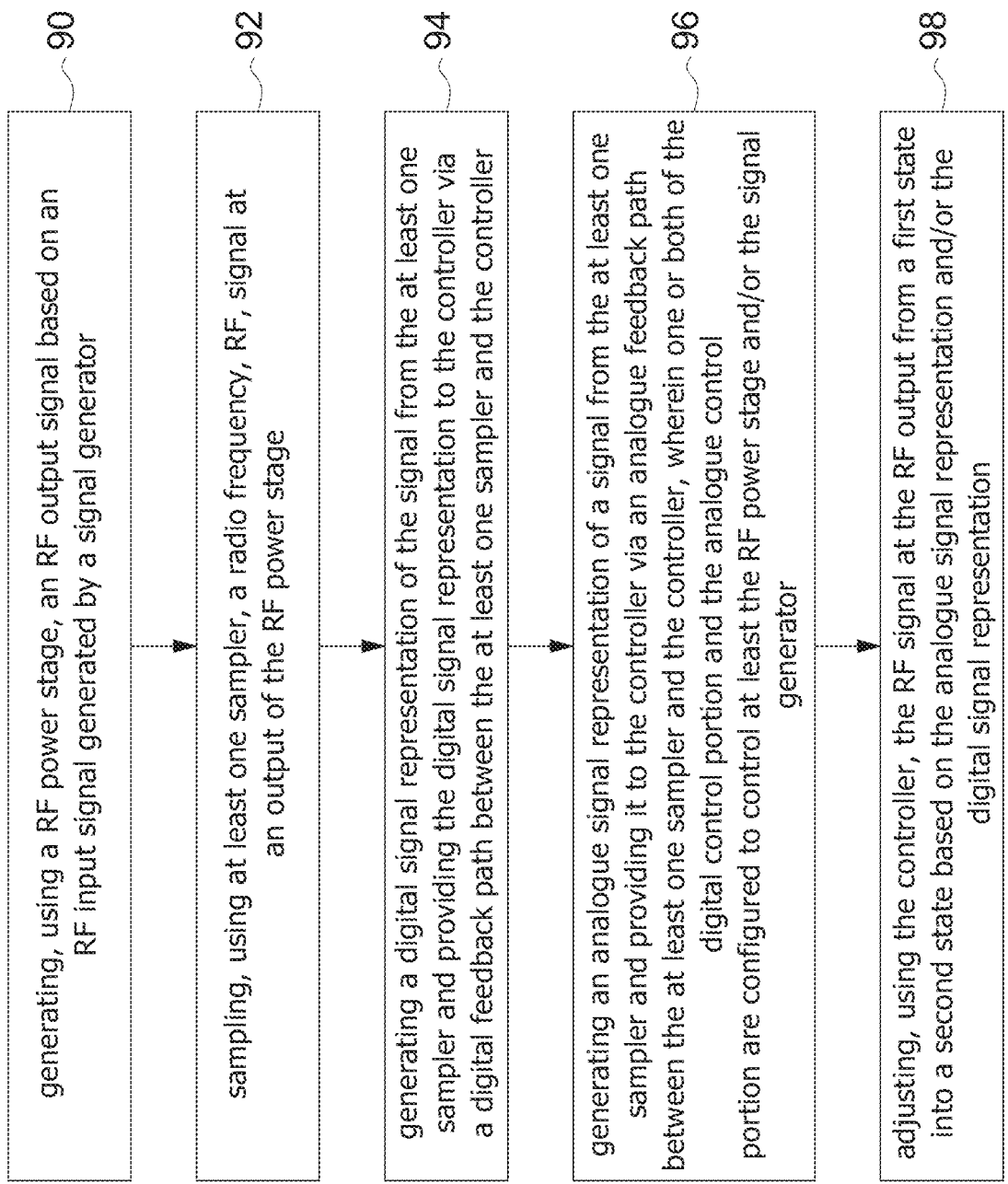
FIG. 7 schematically illustrates a method according to the third aspect.

FIG. 7 illustrates a method according to the third aspect for operating a generator controller according to the third aspect. The method comprises:

generating 90, using an RF power stage, an RF output signal based on an RF input signal generated by a signal generator;

sampling 92, using at least one sampler, a radio frequency, RF, signal at an output of the RF power stage;

generating 94 a digital signal representation of the signal from the at least one sampler and providing the digital signal representation to the controller via a digital feedback path between the at least one sampler and the controller;

generating 96 an analogue signal representation of a signal from the at least one sampler and providing it to the controller via an analogue feedback path between the at least one sampler and the controller, wherein one or both of the digital control portion and the analogue control portion are configured to control at least the RF power stage and/or the signal generator; and adjusting 98, using the controller, the RF signal at the RF output from a first state into a second state based on the analogue signal representation and/or the digital signal representation.

In an embodiment of the method, the at least one sampler comprises first and second samplers connected in cascade (series) to the output of the RF power stage. The first sampler provides a pre-digitized signal for the digital feedback path and the second sampler provides the analogue signal representation from the at least one sampler to the analogue feedback path.

In an embodiment of the method, the at least one sampler comprises a first sampler connected to the output of the RF power stage, and the generator comprises a first and second splitter connected to the output of the first sampler. The first splitter provides a pre-digitized signal for the digital feedback path and the second splitter provides the analogue signal representation from the at least one sampler to the analogue feedback path.

In an embodiment of the method, the at least one sampler provides a forward RF signal and a reflected RF signal to the analogue feedback path and/or the digital feedback path.

In an embodiment of the method, the at least one sampler is, or comprises, at least one directional coupler.

In an embodiment of the method, the digital feedback path comprises at least one analogue-to-digital converter configured to generate the digital signal representation of the signal from the at least one sampler, preferably comprising a pre-analogue-to-digital converter filter.

In an embodiment of the method, the digital signal representation is provided to the digital control portion of the controller.

In an embodiment of the method, the digital control portion of the controller acquires the digital signal representation, and adjusts the gain and/or a power supply level of the power amplifier and/or the RF input signal based on the digital signal representation.

In an embodiment of the method, the at least one analogue-to-digital converter oversamples the signal from the at least one sampler by at least two samples per frequency cycle of the RF input signal generated by the signal generator to provide an oversampled signal.

In an embodiment of the method, the digital control portion obtains a forward and/or reflected power measurement and preferably a load impedance using the oversampled signal.

In an embodiment of the method, the controller further comprises a digital to analogue converter controlled by the digital control portion of the controller, and the digital to analogue converter provides a control signal to the RF power stage and/or a power supply of the generator and/or RF input signal level.

In an embodiment of the method, the controller further comprises a direct analogue control path between the analogue control portion and the RF power stage.

In an embodiment of the method, the digital control portion of the controller acquires the digital signal representation and detects whether the signal at the output of the RF power stage represents a normal operating condition or a fault condition.

In an embodiment of the method, the first state and/or the second state define an expected condition of the generator, and the fault condition defines an arcing condition in a plasma chamber connected to the RF output of the generator.

In an embodiment of the method, the digital control portion of the controller performs a digital comparison of the digital signal representation by comparing the digital signal representation with stored digital signals defining a plurality of fault conditions, and the digital control portion of the controller adjusts the RF signal at the RF output from a first state into a second state based on the result of the digital comparison.

In an embodiment of the method, the analogue control portion of the controller is configured to bypass or to override the digital control portion.

In an embodiment of the method, bypassing or overriding the digital control portion comprises causing the controller to adjust the RF signal at the RF output from the first state into the second state based only on the analogue signal representation if the digital control portion has not identified an abnormal operating condition and the analogue control portion has identified an abnormal operating condition.

In an embodiment of the method, the analogue control portion provides an interrupt signal to the digital control portion when bypassing or overriding the digital control portion.

While at least one exemplary aspect has been presented in the foregoing detailed description of the invention, it should be appreciated that a vast number of variations exist. It should also be appreciated that the exemplary aspect or exemplary aspects are only examples, and are not intended to limit the scope, applicability, or configuration of the invention in any way. Rather, the foregoing detailed description will provide those skilled in the art with a convenient road map for implementing an exemplary aspect of the invention, it being understood that various changes may be made in the function and arrangement of elements described in an exemplary aspect without departing from the scope of the invention as set forth in the appended claims.

What is claimed is:

1. A method for operating a generator, comprising:
generating, using an RF power stage, an RF output signal based on an RF input signal generated by a signal generator;
sampling, using at least one sampler, a radio frequency (RF) signal at an output of the RE power stage;
generating a digital signal representation of the signal from the at least one sampler and providing the digital signal representation to a controller via a digital feedback path between the at least one sampler and the controller;
generating an analogue signal representation of the signal from the at least one sampler and providing the analogue signal representation to the controller via an analogue feedback path between the at least one sampler and the controller, wherein one or both of a digital control portion and an analogue control portion of the controller are configured to control at least the RF power stage and/or the signal generator; and
adjusting, using the controller, the RF output signal from a first state into a second state based on the analogue signal representation and/or the digital signal representation, wherein the at least one sampler provides:
(i) a forward RF signal and a reflected RF signal, or
(ii) a voltage si current signal,
to the analogue feedback path and/or the digital feedback path.

2. The method according to claim 1, wherein the at least one sampler comprises first and second samplers connected in cascade to the output of the RF power stage, wherein the first sampler provides a pre-digitized signal for the digital feedback path and the second sampler provides the analogue signal representation from the at least one sampler to the analogue feedback path.

3. The method according to claim 1, wherein the at least one sampler comprises a first sampler connected to the output of the RF power stage, and the generator further comprises a first and second splitter connected to the output of the first sampler, the first splitter providing a pre-digitized signal for the digital feedback path and the second splitter providing the analogue signal representation from the at least one sampler to the analogue feedback path.

4. The method according to claim 1, wherein the at least one sampler is, or comprises, at least one directional coupler or at least one VI probe.

5. The method according to claim 1, wherein the digital feedback path comprises at least one analogue-to-digital converter configured to generate the digital signal representation of the signal from the at least one sampler, comprising a pre-analogue-to-digital converter filter.

6. The method according to claim 1, wherein the digital signal representation is provided to the digital control portion of the controller.

7. The method according to claim 1, wherein the digital control portion of the controller acquires the digital signal representation, and adjusts a gain and/or a power supply level of the power amplifier and/or the RF input signal based on the digital signal representation.

8. The method according to claim 5, wherein the at least one analogue-to-digital converter oversamples the signal from the at least one sampler by at least two samples per frequency cycle of the RF input signal generated by the signal generator to provide an oversampled signal.

9. The method according to claim 8, wherein the digital control portion obtains a forward and/or reflected power measurement and a load impedance is determined using the oversampled signal.

10. The method according to claim 1, wherein the controller further comprises a digital-to-analogue converter controlled by the digital control portion of the controller, and the digital-to-analogue converter provides a control signal to the RF power stage and/or a power supply of the generator and/or RF input signal level.

11. The method according to claim 1, wherein the controller further comprises a direct analogue control path between the analogue control portion and the RF power stage.

12. The method according to claim 1, wherein the digital control portion of the controller acquires the digital signal representation and detects whether the signal at the output of the RF power stage represents a normal operating condition or a fault condition.

13. The method according to claim 1, wherein the analogue control portion of the controller acquires the analogue signal representation and detects whether the signal at the output of the RF power stage represents a normal operating condition or a fault condition.

14. The method according to claim 12, wherein the first state and/or the second state define an expected condition of the generator, and wherein the fault condition defines an arcing condition in a plasma chamber connected to the RF output of the generator.

15. The method according to claim 1, wherein the digital control portion of the controller performs a digital comparison of the digital signal representation by comparing the digital signal representation with stored digital signals defining a plurality of fault conditions, and the digital control portion of the controller adjusts the RF signal at the RF output from a first state into a second state based on the result of the digital comparison.

16. The method according to claim 1, wherein the analogue control portion of the controller is configured to perform an analogue comparison of the analogue signal representation by comparing the analogue signal representation with thresholds defining a plurality of fault conditions, and wherein the analogue control portion of the controller is configured to adjust the RF signal at the RF output from a first state into a second state based on the result of the analogue comparison.

17. The method according to claim 1, wherein the analogue control portion of the controller is configured to bypass or to override the digital control portion.

18. The method according to claim 1, wherein bypassing or overriding the digital control portion comprises causing the controller to adjust the RF signal at the RF output from the first state into the second state based only on the analogue signal representation if the digital control portion has not identified an abnormal operating condition and the analogue control portion has identified an abnormal operating condition.

19. The method according to claim 1, wherein the analogue control portion provides an interrupt signal to the digital control portion when bypassing or overriding the digital control portion.

20. The method according to claim 19, wherein the digital control portion of the controller, upon receipt of the interrupt signal, pauses or reduces the extent of digital control of the generator for a predefined time, or until a pause signal condition in the generator is met.

21. The method according to claim 19, wherein the digital control portion is configured to restore digital control of the controller upon cessation of the interrupt signal, or until a restore signal condition in the generator is met.

22. The method according to claim 1, wherein the digital control portion comprises a first digital control element and a second digital control element;
wherein at least the second digital control element receives and processes the digital signal representation from the digital feedback path faster than the first digital control element, based on configuration settings of the second digital control element communicated by the first digital control element to the second digital control element, wherein the second digital control element is configured to override the first digital control element in a condition where the configuration settings are exceeded, and wherein the second digital control element is configured to adjust the RF signal at the RF output from the first state into the second state.

23. The method according to claim 1, wherein
a peak detection or envelope detection is performed to receive the analogue signal representation and generate a peak-detection signal or respectively an envelope-detection signal;
a threshold voltage is provided by the digital control portion of the controller; and
a comparison is performed to compare the peak-detection signal or respectively the envelope-detection signal and the threshold voltage, and to generate a high comparator output signal if the peak-detection signal or respectively the envelope-detection signal exceeds the threshold voltage, or vice versa, wherein the high comparator output signal is used as the interrupt signal.

* * * * *

UNITED STATES PATENT AND TRADEMARK OFFICE
CERTIFICATE OF CORRECTION

| | | |
|---|---|---|
| PATENT NO. | : 12,424,425 B2 | Page 1 of 1 |
| APPLICATION NO. | : 18/202555 | |
| DATED | : September 23, 2025 | |
| INVENTOR(S) | : Anton Labanc et al. | |

It is certified that error appears in the above-identified patent and that said Letters Patent is hereby corrected as shown below:

In the Claims

Column 18, Line 13, Claim 1, delete "RE" and insert -- RF --

Column 18, Line 32, Claim 1, delete "si" and insert -- signal and a --

Signed and Sealed this
Eighteenth Day of November, 2025

John A. Squires
*Director of the United States Patent and Trademark Office*